United States Patent
Saito et al.

(10) Patent No.: US 12,374,551 B2
(45) Date of Patent: Jul. 29, 2025

(54) SUBSTRATE TREATMENT METHOD AND SUBSTRATE TREATMENT SYSTEM

(71) Applicant: Tokyo Electron Limited, Tokyo (JP)

(72) Inventors: Yusuke Saito, Koshi (JP); Makoto Muramatsu, Koshi (JP); Hiroyuki Fujii, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 478 days.

(21) Appl. No.: 17/798,992

(22) PCT Filed: Feb. 5, 2021

(86) PCT No.: PCT/JP2021/004234
§ 371 (c)(1),
(2) Date: Aug. 11, 2022

(87) PCT Pub. No.: WO2021/166674
PCT Pub. Date: Aug. 26, 2021

(65) Prior Publication Data
US 2023/0077937 A1 Mar. 16, 2023

(30) Foreign Application Priority Data
Feb. 19, 2020 (JP) .................. 2020-026134

(51) Int. Cl.
*H01L 21/033* (2006.01)
*G03F 7/11* (2006.01)
*H01L 21/027* (2006.01)

(52) U.S. Cl.
CPC ............ *H01L 21/0338* (2013.01); *G03F 7/11* (2013.01); *H01L 21/0274* (2013.01);
(Continued)

(58) Field of Classification Search
CPC ............. H01L 21/0338; H01L 21/0274; H01L 21/0332; H01L 21/0335; H01L 21/0337;
(Continued)

(56) References Cited

U.S. PATENT DOCUMENTS

2012/0223418 A1* 9/2012 Stowers .................. G03F 7/094
257/632
2017/0102612 A1* 4/2017 Meyers ..................... G03F 7/30
(Continued)

FOREIGN PATENT DOCUMENTS

JP 2017-224823 A 12/2017

OTHER PUBLICATIONS

International Search Report of the International Searching Authority mailed Mar. 30, 2021 in corresponding International Application No. PCT/JP2021/004234 (and English translation).

*Primary Examiner* — Caleen O Sullivan
(74) *Attorney, Agent, or Firm* — Posz Law Group, PLC

(57) ABSTRACT

A substrate treatment method for treating a substrate, includes: applying a coating solution containing an organometallic complex, a solvent, and an additive to the substrate to form a solution film of the coating solution; heating the substrate on which the solution film of the coating solution has been formed, to form an organic constituent-containing metal oxide film being a metal oxide film containing an organic constituent contained in the additive; performing dry etching using the organic constituent-containing metal oxide film as a mask; removing the organic constituent in the organic constituent-containing metal oxide film after the dry etching; and removing, by wet etching, a film obtained by removing the organic constituent from the organic constituent-containing metal oxide film.

6 Claims, 6 Drawing Sheets

(52) U.S. Cl.
CPC ...... *H01L 21/0332* (2013.01); *H01L 21/0335* (2013.01); *H01L 21/0337* (2013.01)

(58) Field of Classification Search
CPC ......... H01L 21/02186; H01L 21/02282; H01L 21/02348; H01L 21/32134; H01L 21/32139; H01L 21/02175; H01L 21/32135; H01L 21/67069; H01L 21/67075; H01L 21/67098; H01L 21/6715; G03F 7/11; G03F 7/094
USPC .................................. 438/700; 430/330, 327
See application file for complete search history.

(56) References Cited

U.S. PATENT DOCUMENTS

2019/0341253 A1* 11/2019 Ibata .................. C08G 16/0268
2019/0385837 A1* 12/2019 Chacko ..................... G03F 7/11

* cited by examiner (A)

(D)

(B)

(E)

(C)

(F)

(A)

(B)

(C)

SUBSTRATE TREATMENT METHOD AND SUBSTRATE TREATMENT SYSTEM

CROSS REFERENCE TO RELATED APPLICATION

This application is a U.S. national stage application of International Application No. PCT/JP2021/004234 filed on Feb. 5, 2021, which is based on and claims the benefit of priority of the prior Japanese Patent Application No. 2020-026134 filed on Feb. 19, 2020, the entire contents of which are incorporated herein by reference.

TECHNICAL FIELD

This disclosure relates to a substrate treatment method and a substrate treatment system.

BACKGROUND ART

A method for etching a device layer disclosed in Patent Document 1 includes depositing the device layer on a substrate, depositing a nanocrystalline diamond layer having an average particle diameter of less than 6 nm on the device layer, and forming an etch mask from the nanocrystalline diamond layer. The above method further includes etching the device layer via an etch mask to form a channel, and ashing the nanocrystalline diamond layer. In Patent Document 1, the nanocrystalline diamond layer is deposited using a CVD process.

PRIOR ART DOCUMENT

Patent Document

Patent Document 1: Japanese Laid-open Patent Publication No. 2017-224823

DISCLOSURE OF THE INVENTION

Problems to be Solved by the Invention

A technique according to this disclosure provides a substrate treatment method and a substrate treatment system capable of performing etching using a mask which has high etching resistance and can be formed at a low cost, and easily removing the mask after the etching.

Means for Solving the Problems

An aspect of this disclosure is a substrate treatment method for treating a substrate, includes: applying a coating solution containing an organometallic complex, a solvent, and an additive to the substrate to form a solution film of the coating solution; heating the substrate on which the solution film of the coating solution has been formed, to form an organic constituent-containing metal oxide film being a metal oxide film containing an organic constituent contained in the additive; performing dry etching using the organic constituent-containing metal oxide film as a mask; removing the organic constituent in the organic constituent-containing metal oxide film after the dry etching; and removing, by wet etching, a film obtained by removing the organic constituent from the organic constituent-containing metal oxide film.

Effect of the Invention

According to this disclosure, it is possible to provide a substrate treatment method and a substrate treatment system capable of performing etching using a mask which has high etching resistance and can be formed at a low cost, and easily removing the mask after the etching.

EMBODIMENTS FOR CARRYING OUT THE INVENTION

In a manufacturing step of a semiconductor device or the like, photolithography processing is performed on a semiconductor wafer (hereinafter, referred to as a "wafer"), to form a resist pattern on the wafer. Then, etching of a treatment object layer is performed using the resist pattern as a mask to form a desired pattern on the treatment object layer.

Incidentally, with the miniaturization of semiconductor devices, etching at a high aspect ratio is required for the etching of the treatment object layer. As a technique for this, there is a known technique of forming a hard mask layer higher in etching resistance than the resist film under the resist film, and performing the etching using the hard mask as a mask. For the hard mask layer, a silicon oxide film (hereinafter, referred to as a "TEOS film") formed using, for example, TEOS (Tetra Ethyl Orthosilicate) as a raw material is used. However, with the appearance of a 3D NAND device, a hard mask layer higher in etching resistance is required.

Patent Document 1 discloses the use of the nanocrystalline diamond layer deposited using the CVD process as the etching mask. However, the nanocrystalline diamond layer is formed by the CVD method with low throughput. Accordingly, the nanocrystalline diamond layer is high in cost even though it is higher in etching resistance than the TEOS film. Since the hard mask layer is removed after the etching using the hard mask layer as a mask, it is undesirable to spend a high cost on such a hard mask.

Further, the hard mask layer is required to be easily removable after the etching using the hard mask layer as a mask from the viewpoint of the throughput or the like.

Hence, the technique according to this disclosure provides a substrate treatment method and a substrate treatment system capable of performing etching using a mask which has high etching resistance and can be formed at a low cost, and easily removing the mask after the etching. The technique provides a substrate treatment method and a substrate treatment system for performing etching using a mask which has high etching resistance, can be formed at a low cost, and is easily removable after the etching using the mask. Note that the "etching resistance of the mask" in this description means the resistance of the mask when dry etching is performed using the mask.

Hereinafter, a substrate treatment method and a substrate treatment system according to embodiments will be explained with reference to the drawings. Note that the same codes are given to components having substantially the same functional configurations in the description and the drawings to omit duplicate explanations.

Figure 1:
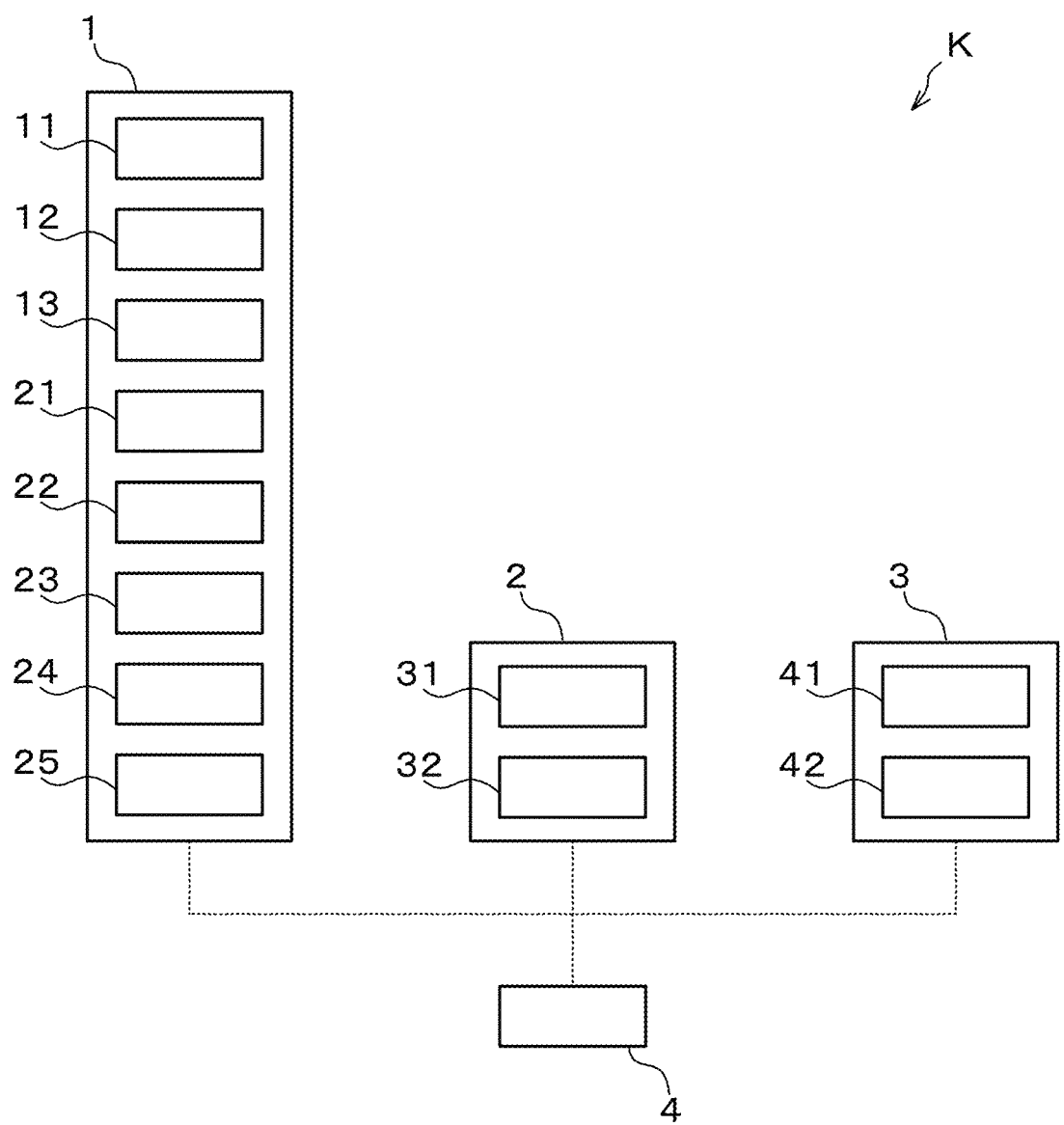
FIG. 1 is a view schematically illustrating the outline of a configuration of a wafer treatment system as a substrate treatment system according to an embodiment.

FIG. 1 is a view schematically illustrating the outline of a configuration of a wafer treatment system as the substrate treatment system according to the embodiment.

As illustrated, a wafer treatment system K has three treatment systems 1 to 3 which perform desired treatments on a wafer W as a substrate. Further, in the wafer treatment system K, a control device 4 is provided. The control device 4 is, for example, a computer including a CPU, a memory and the like, and has a program storage (not illustrated). In the program storage, programs for controlling various treatments in the wafer treatment system K are stored. Note that the programs may be the ones that are recorded in a non-transitory computer-readable storage medium and installed from the storage medium into the control device 4. Some or all of the programs may be implemented by dedicated hardware (circuit board).

In the first treatment system 1, photolithography processing and so on are performed on the wafer W. The first treatment system 1 has a resist coating apparatus 11, a developing apparatus 12, a solution film forming apparatus 13, and first to fifth heating apparatuses 21 to 25.

The resist coating apparatus 11 supplies a resist solution to the wafer W to form a solution film of the resist solution on the wafer W.

The developing apparatus 12 performs a developing treatment on the wafer W using a developing solution.

The solution film forming apparatus 13 applies a mask layer forming solution as a coating solution containing an organometallic complex, a solvent, and additives to the wafer W to form a solution film of the mask layer forming solution on the wafer W. The solution film forming apparatus 13 forms a solution film of the mask layer forming solution before the formation of a resist solution film by the resist coating apparatus 11. The organometallic complex contained in the mask layer forming solution is a complex containing a bond of a metal atom and a carbon atom, and is an organotitanium complex in this embodiment. For the solvent, for example, propylene glycol methyl ether (PGME), propylene glycol monomethyl ether acetate (PGMEA), or a solvent made by mixing them may be used. The additives include an organic matter (hereinafter, referred to as a "density improving organic matter") intended to improve the film density of a later-explained organic constituent-containing metal oxide film as well as those intended to improve wettability and suppress drying. For the density improving organic matter, an organic compound which does not decompose at heating temperatures in the first heating apparatus 21 and the second heating apparatus 22 but remains in the film is used. Especially, in the second heating apparatus 22, heating is performed at high temperature for hydrolysis and dehydration condensation of the organotitanium complex as explained later, and an organic compound which never decomposes even at the high temperature in the second heating apparatus 22 is used for the density improving organic matter.

The resist coating apparatus 11 and the solution film forming apparatus 13 are spin coating apparatuses which apply treatment solutions to the wafer W by a spin coating method to form various films. The resist coating apparatus 11 and the solution film forming apparatus 13 each have a stage (not illustrated) on which the wafer W is mounted, a discharge nozzle (not illustrated) which discharges various treatment solutions, a rotation mechanism (not illustrated) which rotates the stage and thereby rotates the wafer W to diffuse the treatment solution over the surface of the wafer W, and so on, as in the publicly-known spin coating apparatus.

The first heating apparatus 21 heats the wafer W after the formation of the solution film of the mask layer forming solution by the solution film forming apparatus 13. By heating by the first heating apparatus 21, the solvent and the like are removed from the solution film of the mask layer forming solution.

The second heating apparatus 22 heats the wafer after the heating by the first heating apparatus 21. By heating by the second heating apparatus 22, an organic constituent-containing titanium oxide film is formed as the later-explained organic constituent-containing metal oxide film.

The third heating apparatus 23 heats the wafer W after the formation of the resist solution film by the resist coating apparatus 11 and before exposure by an exposure apparatus (not illustrated). In short, the third heating apparatus 23 performs a PAB (Pre-applied bake) treatment. The above exposure apparatus is provided, for example, at a position adjacent to the first treatment system 1.

The fourth heating apparatus 24 heats the wafer W after the above exposure and before development by the developing apparatus 12. In short, the fourth heating apparatus 24 performs a PEB (Post-exposure bake) treatment.

The fifth heating apparatus 25 heats the wafer W after the above development. In short, the fifth heating apparatus 25 performs a post-bake treatment.

The first to fifth heating apparatuses 21 to 25 each have a hot plate (not illustrated) on which the wafer W is mounted and which heats the wafer W at a predetermined temperature and so on as in a publicly-know heating apparatus.

In addition, a wafer carrier apparatus (not illustrated) for carrying the wafer between the apparatuses and so on are provided in the first treatment system 1.

In the second treatment system 2, a plasma treatment using plasma, and more specifically, dry etching using plasma is performed on the wafer W. The second treatment system 2 has a first dry etching apparatus 31 and a second dry etching apparatus 32.

The first dry etching apparatus 31 performs dry etching on the later-explained organic constituent-containing titanium oxide film using a resist pattern formed by the development by the developing apparatus 12 as a mask to thereby form a pattern of the organic constituent-containing titanium oxide film.

The second dry etching apparatus 32 performs dry etching on a treatment object layer using the pattern of the organic constituent-containing titanium oxide film as a mask. The treatment object layer is, for example, a metal carbide layer such as an amorphous silicon layer, a WBC layer containing tungsten (W) or the like which is formed directly under the organic constituent-containing titanium oxide film.

For the first dry etching apparatus 31 and the second dry etching apparatus 32, a publicly-known etching apparatus can be used and, for example, an RIE (Reactive Ion Etching) apparatus is used.

In addition, a wafer carrier apparatus (not illustrated) for carrying the wafer between the apparatuses and so on are provided in the second treatment system 2.

In the third treatment system 3, a removal treatment of a pattern of the organic constituent-containing metal oxide film and so on are performed on the wafer W. The third treatment system 3 has a removing apparatus 41 and a wet etching apparatus 42.

The removing apparatus 41 removes the organic constituent in the organic constituent-containing titanium oxide film after the dry etching by the second dry etching apparatus 32. More specifically, the removing apparatus 41 removes the density improving organic matter in the pattern of the organic constituent-containing titanium oxide film after the above dry etching. For example, the removing apparatus 41 heats the wafer W while irradiating the wafer W with an ultraviolet ray as an energy ray to thereby remove the density improving organic matter, thereby making the pattern of the organic constituent-containing titanium oxide film into a titanium oxide film. In this case, the removing apparatus 41 has, for example, a stage (not illustrated) on which the wafer W is mounted, a UV light source (not illustrated) such as a xenon flash tube or a deuterium lamp which irradiates the wafer W on the stage with an ultraviolet ray having a peak wavelength of 172 nm, and a heating mechanism (not illustrated) such as a resistance heating heater embedded in the stage. Note that the removing apparatus 41 may further have a treatment container (not illustrated) having the stage arranged therein and be configured such that the UV light source is provided outside the treatment container to irradiate the wafer W with the ultraviolet ray via an optical window provided at the treatment container. The above UV light source is configured to be able to irradiate the entire surface of the wafer W with the ultraviolet ray. Note that the peak wavelength of the ultraviolet ray to be radiated is not limited to 172 nm but only needs to be, for example, 150 nm to 200 nm.

The wet etching apparatus 42 removes, by wet etching, the film obtained by removing the organic constituent, namely, the density improving organic matter from the pattern of the organic constituent-containing titanium oxide film.

For the wet etching apparatus 42, a publicly-known apparatus can be used.

In addition, a wafer carrier apparatus (not illustrated) for carrying the wafer between the apparatuses and so on are provided in the third treatment system 3.

Figure 2:
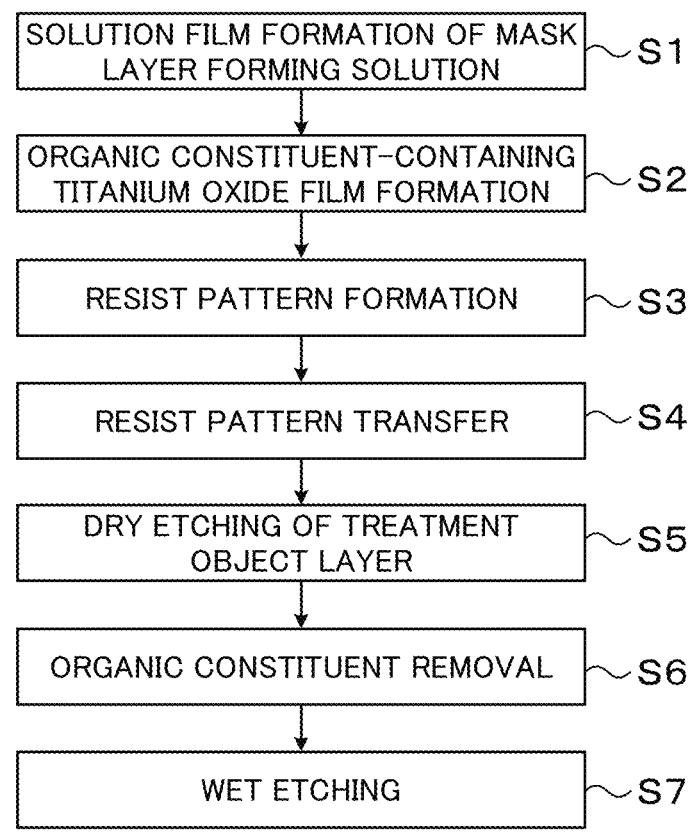
FIG. 2 is a flowchart for explaining an example of a wafer treatment performed in the wafer treatment system in FIG. 1.
Figure 3:
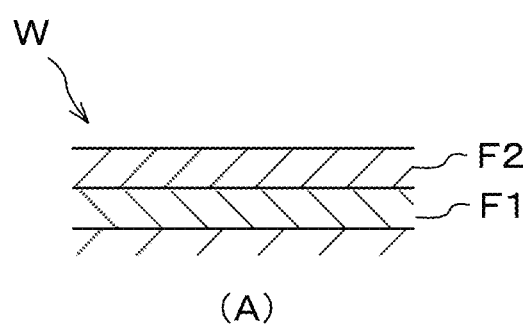
FIG. 3 is a schematic partial sectional view illustrating the state of the wafer W at each step of the wafer treatment.
Figure 3:
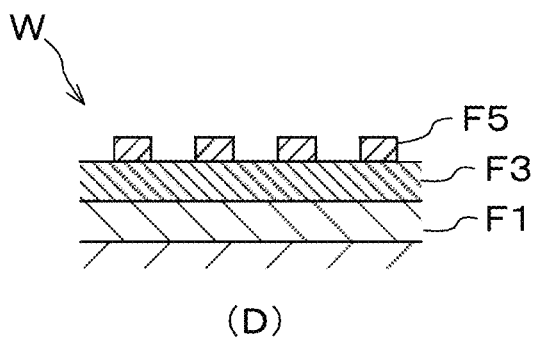
Figure 3:
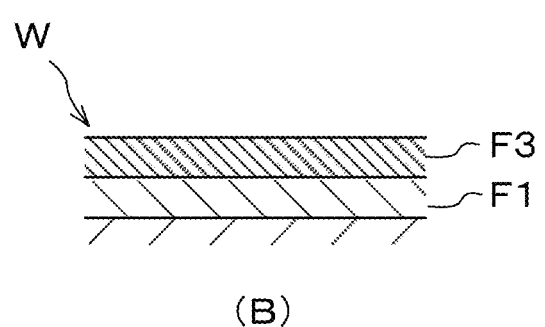
Figure 3:
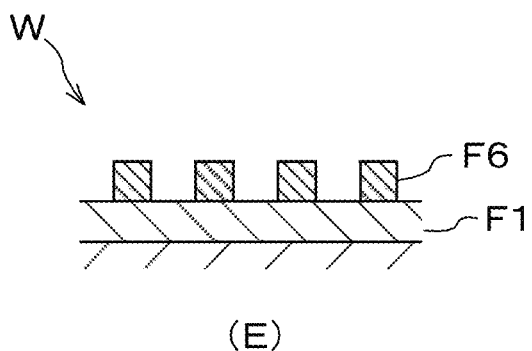
Figure 3:
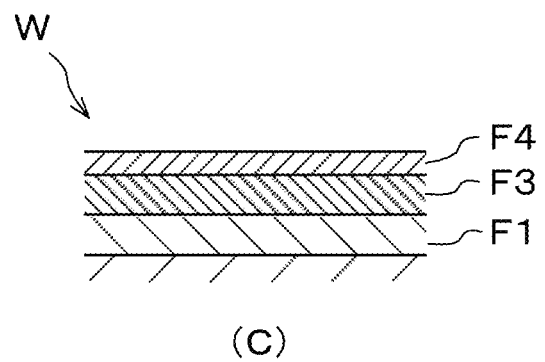
Figure 3:
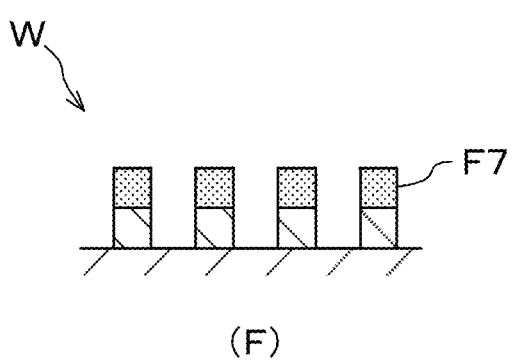
Figure 4:
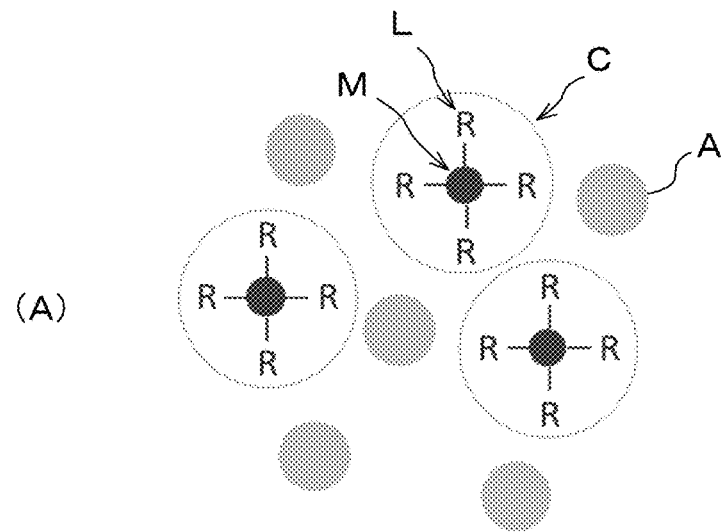
FIG. 4 is a view schematically illustrating a structure of a film formed during the wafer treatment.
Figure 4:
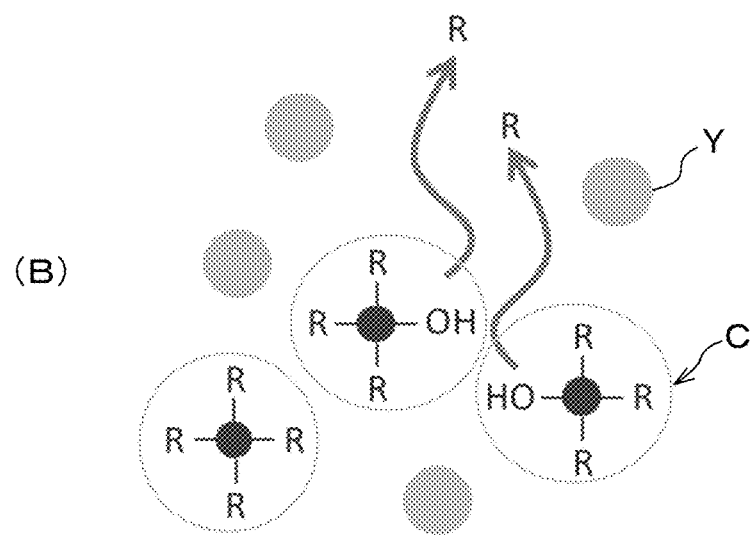
Figure 4:
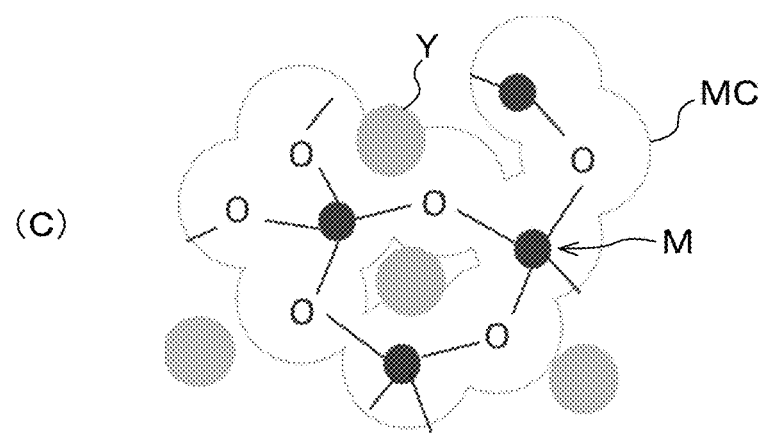

Next, an example of the wafer treatment performed in the wafer treatment system K configured as above will be explained. FIG. 2 is a flowchart for explaining the example of the wafer treatment. FIG. 3 is a schematic partial sectional view illustrating the state of the wafer W at each step of the wafer treatment. FIG. 4 is a view schematically illustrating the structure of a film formed during the wafer treatment. Note that an amorphous silicon film (hereinafter, referred to as an "a-Si film") F1 as the treatment object layer has been formed in advance as illustrated in FIG. 3(A) on the surface of the wafer W to be subjected to the wafer treatment.

(Solution Film Formation of the Mask Layer Forming Solution)

First, as illustrated in FIG. 2 and FIG. 3(A), the mask layer forming solution containing the organotitanium complex and so on is applied to the surface of the wafer W by rotation in the solution film forming apparatus 13 in the first treatment system 1 to form a solution film F2 of the mask layer forming solution in a manner to cover the a-Si film F1 (Step S1). As illustrated in FIG. 4(A), in the state of the solution film F2 of the mask layer forming solution, organotitanium complexes C each containing a titanium atom M and ligands (R) L are independent from each other so that the titanium atoms M are not bonded to each other. Further, the solution film F2 of the mask layer forming solution contains an additive A. Note that the solution film F2 of the mask layer forming solution also contains a solvent though not illustrated.

(Formation of the Organic Constituent-Containing Titanium Oxide Film)

Subsequently, the wafer W on which the solution film F2 of the mask layer forming solution has been formed is heated, whereby an organic constituent-containing titanium oxide film F3 as the organic constituent-containing metal oxide film is formed as illustrated in FIG. 3(B), and more specifically, the solution film F2 on the a-Si film F1 becomes the organic constituent-containing titanium oxide film F3 (Step S2). The organic constituent-containing metal oxide film is a metal oxide film containing the density improving organic matter which has been contained in the additives of the mask layer forming solution, and more specifically, a film existing in a form in which the density improving organic matter intrudes into a metal oxide film structure.

At the step of Step S2, more specifically, the wafer W on which the solution film F2 of the mask layer forming solution has been formed is first heated at a first temperature T1 in the first heating apparatus 21, whereby the solvent in the solution film F2 is removed. In this event, unnecessary additives, and more specifically, additives other than the density improving organic matter are also removed. The first temperature T1 is a temperature which is higher than the boiling point of the solvent in the mask layer forming solution and at which the later-explained hydrolysis and dehydration condensation do not occur, that is, for example, 150° C. to 300° C.

Subsequently, the wafer W from which the solvent and so on have been removed is heated at a second temperature T2 higher than the first temperature T1, for example, under an atmospheric gas atmosphere in the second heating apparatus 22. As a result of the heating, the organotitanium complexes C are hydrolyzed and the hydrolyzed organotitanium complexes C are dehydration condensed as illustrated in FIG. 4(B) and the titanium atoms M are bonded to each other via oxygen (O) to form a titanium oxide film structure MS as illustrated in FIG. 4(C) by moisture and oxygen in the atmosphere. In the process of the hydrolysis and dehydration condensation, a density improving organic matter Y is not removed, but remains in a form of intruding into the titanium oxide film structure MS. The organic constituent-containing titanium oxide film F3 is a film existing in a form in which the density improving organic matter Y intrudes into the titanium oxide film structure MS as above.

Note that the thickness of the organic constituent-containing titanium oxide film F3 after the heating in the second heating apparatus 22 is, for example, 20 to 500 nm. Further, the above second temperature T2 is, for example, 350 to 600° C.

The density improving organic matter Y contained in the organic constituent-containing titanium oxide film F3 is an organic compound which does not decompose at the heating temperatures in the first heating apparatus 21 and the second heating apparatus 22 as explained above. Specifically, the density improving organic matter Y is, for example, a macromolecular organic matter which does not easily decompose. However, in the case of a chain compound with only a single bond between carbon atoms, the metal oxide film structure is not normally formed if the molecular weight is too high. In this case, a cyclic organic compound, a chain compound containing an unsaturated bond between carbon atoms, or the like which does not easily decompose even with a relatively low molecular weight is used as the density improving organic matter Y.

Figure 5:
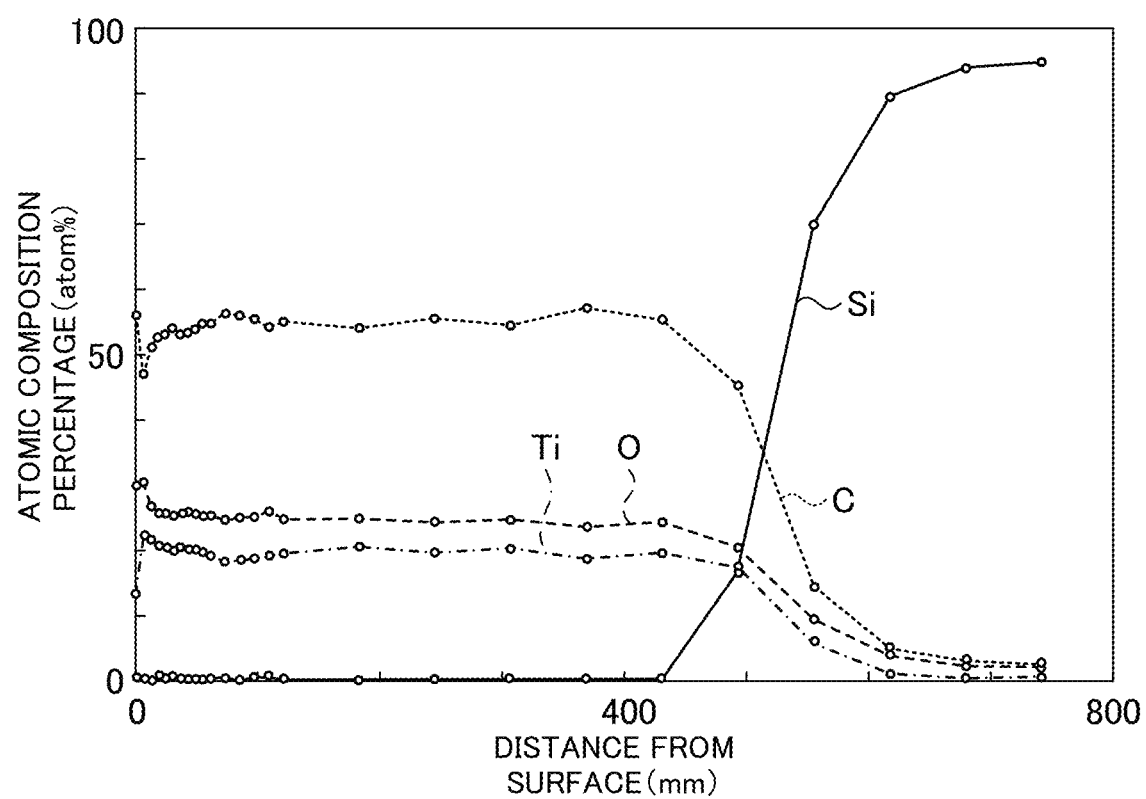
FIG. 5 is a chart illustrating depth-direction distributions of mass density percentages of titanium atoms, oxygen atoms, carbon atoms, and silicon atoms in the wafer W after heating in a first heating apparatus and a second heating apparatus.

FIG. 5 is a chart illustrating depth-direction distributions of atomic composition percentages (atom %) of titanium atoms, oxygen atoms, carbon atoms, and silicon atoms in the wafer W after the heating in the first heating apparatus 21 and the second heating apparatus 22. The chart illustrates an example when the organic constituent-containing titanium oxide film F3 having a thickness of about 400 nm was formed on a bare silicon wafer.

As illustrated in the chart, in the organic constituent-containing titanium oxide film F3 after being heated in the first heating apparatus 21 and the second heating apparatus 22, the atomic composition percentages of titanium atoms, oxygen atoms, and carbon atoms are almost uniform without deviation in the depth direction, in other words, the composition ratio is almost uniform in the depth direction. Further, the percentage of the carbon atoms in the organic constituent-containing titanium oxide film F3 after being heated in the first heating apparatus 21 and the second heating apparatus 22 is about 50% which is relatively high.

The above shows that the organic constituent contained in the mask layer forming solution is not removed but remains in the film after the heating in the first heating apparatus 21 and the second heating apparatus 22.

Note that the organic constituent-containing titanium oxide film F3 seems to be close to the structure of a titanium oxide in terms of the atomic composition percentages. However, it is inferred that the structure of the organic constituent-containing titanium oxide film F3 does not form the structure of pure titanium oxide, the structure of pure titanium dioxide or the like as a whole because a portion of a bond of the titanium atom and the oxygen atom (Ti—O bond) formed by reaction proceeding due to the heating and a portion of a bond of an unreacted titanium atom and the ligand (Ti—R bond) exist in a mixed manner.

Further, the present inventors have confirmed that when the heating temperature in the second heating apparatus 22 becomes a certain temperature (for example, 600° C.) or higher, the film thickness of the organic constituent-containing titanium oxide film F3 decreases. This is considered that when the heating temperature in the second heating apparatus 22 becomes the certain temperature or higher, the density improving organic matter starts to decompose.

The explanation is returned to that of the wafer treatment.
(Formation of the Resist Pattern)

After the formation of the organic constituent-containing titanium oxide film F3, a resist pattern is formed (Step S3).

Specifically, first, a resist solution is applied by rotation to the surface of the wafer W in the resist coating apparatus 11 to form a solution film of the resist solution in a manner to cover the organic constituent-containing titanium oxide film F3.

Subsequently, the wafer W is subjected to the PAB treatment in the third heating apparatus 23, whereby a resist film F4 is formed on the organic constituent-containing titanium oxide film F3 as illustrated in FIG. 3(C).

Next, the wafer is subjected to exposure processing in a desired pattern in the exposure apparatus (not illustrated).

Subsequently, the wafer W is subjected to the PEB treatment in the fourth heating apparatus 24.

Then, the wafer W is subjected to the developing treatment in the developing apparatus 12, whereby a resist pattern F5 is formed as illustrated in FIG. 3(D). Thereafter, the wafer W is subjected to the post-bake treatment in the fifth heating apparatus 25.

(Transfer of the Resist Pattern)

After the formation of the resist pattern F5, the resist pattern F5 is transferred to the organic constituent-containing titanium oxide film F3, whereby a pattern F6 of the organic constituent-containing titanium oxide film is formed as illustrated in FIG. 3(E) (Step S4).

Specifically, for example, the wafer W is carried into the second treatment system 2 and the organic constituent-containing titanium oxide film F3 is subjected to dry etching using the resist pattern F5 as a mask in the first dry etching apparatus 31, whereby the pattern of the resist pattern F5 is transferred to the organic constituent-containing titanium oxide film F3. Then, in an ashing apparatus (not illustrated), the resist pattern F5 is removed, whereby the pattern F6 of the organic constituent-containing titanium oxide film is formed as illustrated in FIG. 3(E). For the dry etching of the organic constituent-containing titanium oxide film F3, for example, a chlorine ($Cl_2$) gas or a boron trichloride ($BCl_3$) gas is used.

(Dry Etching of the Treatment Object Layer)

Subsequently, in the second dry etching apparatus 32, the a-Si film F1 being the treatment object layer is subjected to dry etching using the pattern F6 of the organic constituent-containing titanium oxide film as a mask (Step S5). For the dry etching of the treatment object layer, a Cl-based gas is used. The Cl-based gas is gas containing Cl (chloride) and is, for example, a hydrogen chloride (HCl) gas or the like. Besides, in place of the Cl-based gas, an F-based gas containing fluorine (F) such as a sulfur hexafluoride ($SF_6$) gas may be used.

(Removal of the Organic Constituent)

Thereafter, the density improving organic matter Y is removed from the pattern F6 of the organic constituent-containing titanium oxide film (Step S6). Thus, the pattern F6 of the organic constituent-containing titanium oxide film becomes a pattern F7 of the titanium oxide film containing no density improving organic matter Y as illustrated in FIG. 3(F).

At Step S6, specifically, the wafer W is carried into the third treatment system 3, and the wafer W is heated at the third temperature T3 in the removing apparatus 41, in which state the wafer W is irradiated with the ultraviolet ray, whereby the density improving organic matter Y is removed. The irradiation of the ultraviolet ray is performed, for example, under the atmospheric gas atmosphere. The ozone and active oxygen produced by the irradiation of the ultraviolet ray under the atmospheric gas atmosphere oxidizes the density improving organic matter Y. The oxidized density improving organic matter Y is to be volatilized and removed, and its volatilization rate can be increased by heating. Note that as the third temperature T3 is made higher, the removal of the density improving organic matter Y can be performed at a higher rate. The third temperature T3 is, for example, 200 to 600° C.

(Wet Etching)

Then, in the wet etching apparatus 42, the pattern F7 of the titanium oxide film containing no density improving organic matter Y is removed by wet etching (Step S7). For the etching solution, for example, a dilute hydrofluoric acid can be used. In place of dilute hydrofluoric acid, SPM (Sulfuric acid Peroxide Mixture) may be used.

In the case where the pattern F7 of the titanium oxide film is thick or the like, the removal treatment of the organic constituent at Step S6 and the wet etching treatment at Step S7 may be alternately repeated.

With the above, the wafer treatment performed in the wafer treatment system K is completed.

Figure 6:
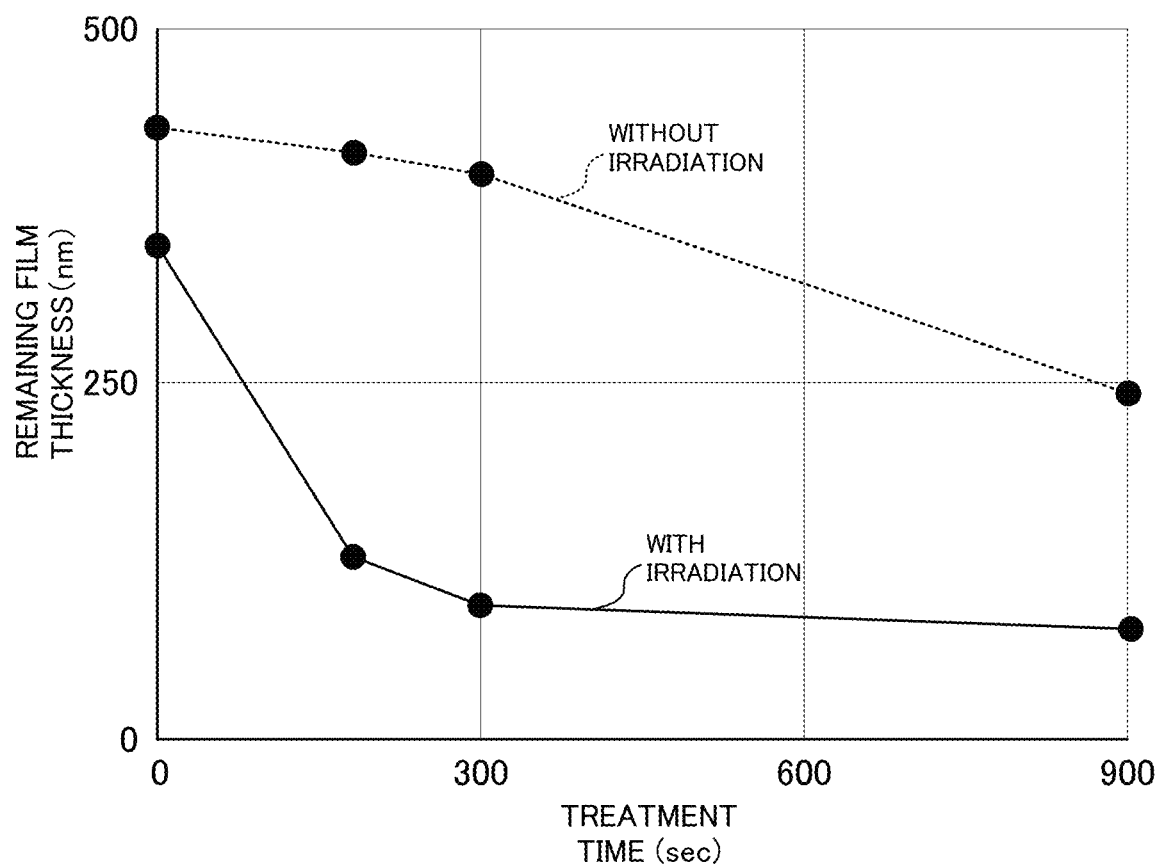
FIG. 6 is a chart illustrating influence of ultraviolet irradiation processing on a wet etching treatment.

FIG. 6 is a chart illustrating the influence of ultraviolet irradiation processing on the wet etching treatment. The chart illustrates results in a case where the ultraviolet irradiation processing was performed on the organic constituent-containing titanium oxide film formed over the entire surface of a bare silicon wafer and then the wet etching was performed with 0.5% dilute hydrofluoric acid, and a case where the same wet etching was performed without performing the ultraviolet irradiation processing. The 0.5% dilute hydrofluoric acid is the one used in the wet etching of the titanium oxide film formed by the CVD method or the like. In the chart, the horizontal axis represents the treatment time, and the vertical axis represents the remaining film thickness after the wet etching. Note that an ultraviolet ray having a peak wavelength of 172 nm was radiated in the ultraviolet irradiation processing.

As illustrated in the chart, in the case of not performing the ultraviolet irradiation processing, the film thickness reduces by only about 30 nm in a treatment time of the wet etching of 300 seconds. In contrast to this, in the case of performing the ultraviolet irradiation processing, the thickness of the organic constituent-containing titanium oxide film reduces by about 250 nm that is about eight times that in the case of not performing the ultraviolet irradiation processing even in the same treatment time of the wet etching of 300 seconds.

This shows that the organic constituent-containing titanium oxide film can be easily peeled off in a short time by performing the ultraviolet irradiation processing. Note that a conceivable reason why the rate of the wet etching of the organic constituent-containing titanium oxide film increases by the ultraviolet irradiation processing is that the reaction between the dilute hydrofluoric acid and the titanium oxide film structure is inhibited by the density improving organic matter, whereas the ultraviolet irradiation processing reduces the density improving organic matter to prevent the inhibition of the above reaction.

In the results illustrated in the chart, when the treatment time of the wet etching exceeds 300 seconds in the case where the ultraviolet irradiation processing was performed, the remaining film thickness rarely changes regardless of the treatment time of the wet etching, and the organic constituent-containing titanium oxide film remains about 80 nm even in the treatment time of the wet etching of 900 seconds. However, the organic constituent-containing titanium oxide film can be removed by the wet etching by thinning the organic constituent-containing titanium oxide film, adjusting the ultraviolet ray irradiation amount, or changing the wavelength of the ultraviolet ray.

As explained above, the substrate treatment method according to this embodiment includes: applying a mask layer forming solution containing an organometallic complex, a solvent, and an additive to the wafer W to form a solution film of the mask layer forming solution; heating the wafer W on which the solution film has been formed to form an organic constituent-containing metal oxide film being the metal oxide film containing an organic constituent contained in the additive; and performing dry etching using the organic constituent-containing metal oxide film as a mask. More specifically, in this embodiment, the organic constituent-containing metal oxide film is used as a mask when performing dry etching of the treatment object layer. The organic constituent-containing metal oxide film can be formed only by the application of the mask layer forming solution and the heating and can be formed at high throughput, and is thus low in cost. Further, the organic constituent-containing metal oxide film has, as a skeleton, a metal oxide film in which the silicon atom of the TEOS film is replaced with a metal atom, and is high in etching resistance than the TEOS film because the metal atom hardly volatilizes as compared with the silicon atom. Furthermore, the organic constituent-containing metal oxide film contains an organic constituent and is high in density, and therefore has higher etching resistance. In the test actually carried out by the present inventors, the selection ratio of the organic constituent-containing titanium oxide film being one example of the organic constituent-containing metal oxide film when dry etching the a-Si film F1 using the Cl-based gas was 4.9 times the TEOS film at a temperature of the wafer W during dry etching of 400° C., and 5.9 times at 500° C. and 5.7 times at 600° C. in the same case. Therefore, according to this embodiment, it is possible to provide a substrate treatment method for performing dry etching using a mask high in etching resistance.

The substrate treatment method according to this embodiment further includes: removing the organic constituent in the organic constituent-containing metal oxide film after the dry etching using the organic constituent-containing metal oxide film as a mask; and removing, by wet etching, a film obtained by removing the organic constituent from the organic constituent-containing metal oxide film. These two steps can easily remove the organic constituent-containing metal oxide film having high etching resistance used as a mask.

Therefore, according to this embodiment, it is possible to provide a substrate treatment method capable of performing etching using a mask which has high etching resistance and can be formed at a low cost, and easily removing the mask after the etching.

In this embodiment, the organic matter is intentionally left in the metal oxide film for a mask as explained above. Once the organic matter is left as above, its removal is difficult when the metal oxide film becomes unnecessary. Hence, the above organic matter is removed from the metal oxide film after etching.

Further, in this embodiment, the pattern of the organic constituent-containing metal oxide film can be removed even if the treatment time of the wet etching for removing the pattern is short. Accordingly, it is possible to reduce the damage, due to the above wet etching, to the structure lower than the pattern of the organic constituent-containing metal oxide film.

Further, the organic constituent-containing metal oxide film is high in etching resistance and therefore may be formed thin. When the organic constituent-containing metal oxide film is formed thin, it is possible to more accurately transfer the resist pattern to the organic constituent-containing metal oxide film, and to more easily remove the organic constituent-containing metal oxide film.

In the above explanation, the removal treatment of the density improving organic matter is a treatment of heating it while performing the irradiation of the ultraviolet ray. In place of the ultraviolet ray, another energy ray such as an electron ray or the like may be radiated. Besides, the removal treatment of the density improving organic matter may be a treatment of simply heating the wafer W at high temperature without the irradiation of the energy ray. In this case, it is preferable that the wafer W is heated at a temperature higher than the second temperature T2 which is the heating temperature in the second heating apparatus 22.

In the above, the ultraviolet irradiation processing is performed under the atmospheric gas atmosphere, but an oxidation gas such as an ozone gas may be supplied to a treatment space during the ultraviolet irradiation processing.

Besides, the oxidation gas may be supplied also in the case of heating the wafer W at high temperature without the irradiation of the ultraviolet ray as explained above. The supply of the oxidation gas makes it possible to perform the removal treatment of the density improving organic matter in a short time.

As explained above, various methods can be employed for the removal treatment of the density improving organic matter, leading to a wide range of choices of the organic compound used as the density improving organic matter. Therefore, the ranges of choices of the organotitanium complex and the additives other than the density improving organic matter are expanded. In short, according to this embodiment, there is a wide range of choices of the mask layer forming solution.

Note that an ultraviolet ray other than the one having a peak wavelength of 150 to 200 nm, for example, an ultraviolet ray having a peak wavelength of 222 nm or 254 nm may be used as the ultraviolet ray used for the removal treatment of the density improving organic matter. In this case, the oxidation gas such as an ozone gas or the like is supplied to the treatment space during the ultraviolet irradiation processing.

The amorphous silicon layer or the like being the treatment object layer in this embodiment itself is a hard mask, and an actual etching object layer is, for example, an ONO film lower than the amorphous silicon layer or the like. The pattern of the organic constituent-containing metal oxide film is not removed, but the etching of the etching object layer such as the ONO film or the like may be performed using, as a mask, a layered pattern made by layering the pattern of the organic constituent-containing metal oxide film and the pattern of amorphous silicon. Further, the organic constituent-containing metal oxide film may be formed directly on the etching object layer such as the ONO film or the like, and dry etching of the ONO film or the like may be performed using the organic constituent-containing metal oxide film as a mask.

The heating at the first temperature T1 and the hating at the second temperature T2 are performed in different apparatuses in the above example, but may be performed in the same apparatus. In other words, the first heating apparatus 21 and the second heating apparatus 22 may be united.

The metal oxide film forming the skeleton of the organic constituent-containing metal oxide film is the titanium oxide film in the above example, but may be a zirconium oxide, aluminum oxide, tin oxide film or the like.

The dilute hydrofluoric acid or SPM is used for the wet etching of the organic constituent-containing metal oxide film after the density improving organic matter is removed in the above example, but another etching solution may be used, and the etching solution may be changed according to the film kind of the organic constituent-containing metal oxide film The embodiments disclosed herein are examples in all respects and should not be considered to be restrictive. Various omissions, substitutions and changes may be made in the embodiments without departing from the scope and spirit of the attached claims.

EXPLANATION OF CODES 13 solution film forming apparatus
21 first heating apparatus
22 second heating apparatus
31 first dry etching apparatus
32 second dry etching apparatus
41 removing apparatus
42 wet etching apparatus
F2 solution film
F3 organic constituent-containing titanium oxide film
A additive
C organotitanium complex
K wafer treatment system
W wafer
Y density improving organic matter

What is claimed is:

1. A substrate treatment method for treating a substrate, comprising:
    applying a coating solution containing an organometallic complex, a solvent, and an additive to the substrate to form a solution film of the coating solution;
    heating the substrate on which the solution film of the coating solution has been formed, to form an organic constituent-containing metal oxide film being a metal oxide film containing an organic constituent contained in the additive;
    performing dry etching using the organic constituent-containing metal oxide film as a mask;
    removing the organic constituent in the organic constituent-containing metal oxide film after the dry etching; and
    removing, by wet etching, a film obtained by removing the organic constituent from the organic constituent-containing metal oxide film.

2. The substrate treatment method according to claim 1, wherein
    the organic constituent is for improving a film density of the organic constituent-containing metal oxide film.

3. The substrate treatment method according to claim 1, wherein
    the removing the organic constituent removes the organic constituent by irradiating the substrate, on which the organic constituent-containing metal oxide film has been formed, with an ultraviolet ray while heating the substrate.

4. The substrate treatment method according to claim 1, wherein
    the forming the organic constituent-containing metal oxide film forms the organic constituent-containing metal oxide film by hydrolyzing the organometallic complex and dehydrating and condensing the hydrolyzed organometallic complexes to each other.

5. The substrate treatment method according to claim 4, wherein
    the forming the organic constituent-containing metal oxide film comprises:
    heating the substrate on which the solution film of the coating solution has been formed, at a first temperature to remove the solvent in the solution film of the coating solution; and
    heating the substrate on which the solvent has been removed from the solution film of the coating solution, at a second temperature higher than the first temperature to hydrolyze the organometallic complex and dehydrate and condense the hydrolyzed organometallic complexes to each other to form the organic constituent-containing metal oxide film.

6. The substrate treatment method according to claim 1, further comprising:
    forming a resist pattern on the organic constituent-containing metal oxide film; and
    transferring the resist pattern to the organic constituent-containing metal oxide film, wherein the performing dry etching performs the dry etching using, as a mask, the organic constituent-containing metal oxide film to which the resist pattern has been transferred.

\* \* \* \* \*